(12) United States Patent
Noel

(10) Patent No.: US 10,847,216 B2
(45) Date of Patent: Nov. 24, 2020

(54) SRAM MEMORY HAVING A REDUCED LEAKAGE CURRENT

(71) Applicant: COMMISSARIAT A L'ENERGIE ATOMIQUE ET AUX ENERGIES ALTERNATIVES, Paris (FR)

(72) Inventor: Jean-Philippe Noel, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/512,497

(22) Filed: Jul. 16, 2019

(65) Prior Publication Data
US 2020/0035294 A1 Jan. 30, 2020

(30) Foreign Application Priority Data
Jul. 17, 2018 (FR) ...................... 18 56608

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ... G11C 11/419; G11C 11/418; G11C 11/412; G11C 5/14
See application file for complete search history.

(56) References Cited

U.S. PATENT DOCUMENTS

| | | | | |
|---|---|---|---|---|
| 9,679,637 B1 * | 6/2017 | Hsu | ................ | G11C 7/14 |
| 10,050,045 B1 * | 8/2018 | Hsu | ................ | G11C 11/419 |
| 2006/0215465 A1 * | 9/2006 | Bhavnagarwala | ....... | G11C 8/08 365/189.12 |
| 2007/0279996 A1 * | 12/2007 | Rolandi | ............ | G11C 16/3418 365/185.22 |
| 2014/0269091 A1 * | 9/2014 | Zheng | .................. | G11C 11/418 365/185.21 |
| 2016/0125942 A1 | 5/2016 | Yoon et al. | | |
| 2016/0254045 A1 * | 9/2016 | Mazumder | ............ | G11C 11/412 365/72 |

(Continued)

OTHER PUBLICATIONS

French Preliminary Search Report dated May 29, 2019 in French Application 18 56608 filed on Jul. 17, 2018 (with English Translation of categories of Cited Documents).

(Continued)

*Primary Examiner* — Toan K Le
(74) *Attorney, Agent, or Firm* — Oblon, McClelland, Maier & Neustadt, L.L.P.

(57) ABSTRACT

SRAM memory including:
 a matrix of memory cells;
 bit lines and word lines;
 read ports associated with the memory cells and coupled to the bit lines and to the word lines;
 local virtual ground, LVGND, lines each coupled to the reference potential terminals of the read ports of at least one row of memory cells;
 local control elements each configured to electrically couple one of the LVGND lines to a power supply potential or to a global virtual ground line, or GVGND line;
 a global control element configured to couple the GVGND line to the power supply electric potential or to a reference electric potential.

12 Claims, 5 Drawing Sheets

(56) References Cited

U.S. PATENT DOCUMENTS

2017/0352408 A1* 12/2017 Agarwal .................. G11C 5/14

OTHER PUBLICATIONS

Verma, N., et al., "A 65 nm 8T Sub-$V_t$ SRAM Employing Sense-Amplifier Redundancy", IEEE International Solid State Circuits Conference, Feb. 2007, 3 pages.
Calhoun, B., et al., "A 256-kb 65-nm Sub-threshold SRAM Design for Ultra-Low-Voltage Operation", IEEE Journal of Solid-State Circuits, vol. 42, No. 3, 2007, pp. 680-688.
U.S. Appl. No. 16/210,663, filed Dec. 5, 2018, 2019-0172526 A1, Noel, J., et al.

* cited by examiner

SRAM MEMORY HAVING A REDUCED LEAKAGE CURRENT

TECHNICAL FIELD

The technical field concerned is that of Static Random Access Memories (SRAM). Advantageously, this document applies to the production of IoT (Internet of Things) oriented asynchronous circuits for "normally OFF/instant ON" type applications.

PRIOR ART

SRAM type memories are the embedded memories the most used notably for the speed thereof (read/write) as well as for the reliability thereof (compared to DRAM, "Dynamic Random Access Memory" or FLASH type memories).

In addition, as opposed to the other types of memories (DRAM, FLASH, etc.), SRAM memories may be used as multiport memories, which means that a plurality of rows of a matrix of memory cells, also called binary cells or memory points, of a SRAM memory may be simultaneously activated in order to perform therein read and/or write operations. This mode of use is significantly widespread, notably in memories used as register files in processors, but also in some circuits that need to have asynchronous accesses to the memory, that is to say accesses to different frequencies, such as, for example, networking circuits, or circuits used in communication networks.

In order to produce such a SRAM memory circuit, each memory cell consists of a conventional memory cell with 6 transistors (6T-SRAM) to which one or more read ports and/or additional access transistors for writing are added. Such as circuit is called an NRMW memory circuit (where N is the number of read accesses and M the number of write accesses in the same operating cycle of the circuit) or PRW (where P is the number of read/write accesses in the same operating cycle of the circuit). In an NRMW, the memory cells have dedicated read ports whereas in a PRW memory circuit, the memory cells have unseparated ports for the read and the write. By way of examples, a SRAM memory circuit comprising conventional memory cells with 6 transistors, or 6T-SRAM, corresponds to a 1RW memory circuit, and a SRAM memory circuit including conventional memory cells with 8 transistors known as "dual-port", 8T-DP-SRAM, corresponds to a 2RW memory circuit.

However, the use of additional access transistors and/or read ports in a SRAM cell generates an increase in leakage currents $I_{OFF}$ of the cell. Yet, in a memory circuit of an ASIC (Application-Specific Integrated Circuit) or of a SoC (System on Chip) dedicated to the market of the IoT where the default operating mode corresponds to the standby mode, the priority is to limit as much as possible the power consumption in standby mode which corresponds to the leakage currents $I_{OFF}$ of the memory circuit. This is why the use of additional read ports and/or access transistors in the memory cells must not lead to significant excessive power consumption compared to the portion of the memory that is only used for the storage.

This problem is all the more important when the SRAM cell operates with a very low supply voltage, for example between approximately 0.3 V and 0.4 V. Indeed, a drop in supply voltage generates a drop in conduction current $I_{ON}$, and therefore a drop in the value of the ratio between the conduction current $I_{ON}$ and the leakage currents $I_{OFF}$ of the transistors of the memory cell, which is problematic for read data stored in a memory cell selected due to the rapidity with which the read current discharges through the bit line (or BL) to which the memory cell is connected.

In order to limit the impact of a low $I_{ON}/I_{OFF}$ ratio on the reading of a memory cell provided with a read port, there are two solutions.

The first solution consists in limiting the number of memory cells per column of the memory. Thus, the global leakage current on each column, corresponding to the sum of the leakage currents of the transistors of each memory cell of the column, is reduced. However, with a very low supply voltage, this number of memory cells per column may be relatively low (8, 16 or even 32) to have a sufficient $I_{ON}/I_{OFF}$ ratio for a correct reading of the memory cells, which may generate a substantial loss of surface related to the addition of local inputs/outputs if a large number of columns is required to compensate for the low number of rows of memory cells.

A second solution proposed in the documents N. Verma et al., "A 65 nm 8T Sub-Vt SRAM Employing Sense-Amplifier Redundancy", IEEE International Solid-State Circuits Conference. Digest of Technical Papers, pp. 328-330, 2007, and B. Calhoun et al., "A 256-kb 65-nm Sub-threshold SRAM Design for Ultra-Low-Voltage Operation", IEEE Journal of Solid-State Circuits, Vol. 42, No. 3, March 2007, consists in connecting the transistors of the read ports of each row of memory cells not to the ground but to a virtual ground (or VGND) electrical line on which the value of the electric potential that is applied is controlled by a control element, or driver, which corresponds, for example, to an inverter. In standby mode or for the rows of memory cells not read, the electric potential applied on the VGND lines to which the read ports of the memory cells not read are connected has a value similar to same of the precharge electric potential of the bit lines, equal to same of the power supply electric potential. Therefore, there is a zero difference of potentials between the bit lines and the VGND lines to which the read ports of the memory cells not read are connected, and therefore no leakage currents below the threshold (which is the main leakage current of a transistor) generated in the transistors of these read ports. When a row of memory cells is read, the electric potential of the VGND line to which the read ports of the memory cells read are connected is set to 0 V (to the ground) to enable the reading of the memory cells. This second solution prevents a reduction in the number of memory cells per column, as well as the loss of surface that may result therefrom.

Nevertheless, this second solution only partially solves the problem posed by the leakage currents because although the leakage currents of the read ports are eliminated, new leakage currents corresponding to same of the transistors of the control elements to which the VGND lines are connected are added.

In this second solution, the control element of the VGND line to which the read ports of the memory cells read are connected must be capable of allowing a current to pass through equivalent to $N \times I_{READ}$, with N corresponding to the number of memory cells per row, and $I_{READ}$ corresponding to the read current of a memory cell. This has the consequence that the size of the transistor of the control element passed through by the N read currents must be relatively substantial.

Document N. Verma et al., "A 65 nm 8T Sub-Vt SRAM Employing Sense-Amplifier Redundancy", IEEE International Solid-State Circuits Conference. Digest of Technical Papers, pp. 328-330, 2007 proposes to connect the control elements of the VGND lines to a circuit, called booster circuit, temporarily increasing the electric potential applied on the VGND line to a value greater than the supply voltage. This allows the size of the transistors of the control elements that are passed through by the read currents to be minimised whilst maintaining the capacity thereof to allow a current to pass through equivalent to $N \times I_{READ}$. Nevertheless, this solution only remains partially satisfactory since the booster circuit is complex, cumbersome (notably due to the capacity having to be present in the booster circuit) and increases the static and dynamic consumption of the memory. In addition, this booster circuit does not eliminate the leakage currents of the transistors of the control elements connected to the VGND lines.

DESCRIPTION OF THE INVENTION

Therefore, there is a need to propose a SRAM memory wherein the leakage currents of the read ports are eliminated, which does not limit the number of memory cells per column of the memory, which does not generate loss of surface, and which reduces the leakage currents globally present in the memory compared to the solutions of prior art.

For this, it is proposed a SRAM including at least:
one matrix of memory cells forming the columns and rows of memory cells;
bit lines each associated with one of the columns of memory cells, and word lines each associated with one of the rows of memory cells;
read ports each associated with one of the memory cells and coupled to one of the bit lines and one of the word lines;
local virtual ground lines, called LVGND lines, each coupled to the reference potential terminals, or ground terminals, of the read ports of at least one of the rows of memory cells;
local control elements each configured to electrically couple one of the LVGND lines to a power supply electric potential applied on a first power supply terminal of the local control elements or to a global virtual ground line, or GVGND line, to which a second power supply terminal of the local control elements is coupled;
one global control element configured to couple the GVGND line to the power supply electric potential or to a reference electric potential.

Thus, in standby mode, the electric potential applied on the LVGND lines by the local control elements may have a value similar to same of the precharge electric potential of the bit lines, equal to same of the power supply electric potential. Therefore, in this case there is a zero difference of potentials between the bit lines and the LVGND lines, and therefore no leakage currents below the threshold generated in the read ports that are coupled to the bit lines and to the LVGND lines.

In addition, in standby mode, the electric potential applied on the GVGND line by the global control element may correspond to the power supply electric potential. The local control elements are in this case subjected, between the electric supply potential and the GVGND line, to a substantially zero difference of electric potentials, also preventing the generation of leakage currents below the threshold in the local control elements.

In addition, the solution proposed here does not limit the number of memory cells per column or loss of surface.

This SRAM memory is advantageously used with a low supply voltage, for example, between approximately 0.3 V and 0.4 V, since the reduction of the leakage currents obtained makes it possible to maintain a sufficient $I_{ON}/I_{OFF}$ ratio for correctly reading the data in the memory cells, and this even with a significant number of rows of memory cells.

The bit lines correspond to the rows from which a reading or writing of data is carried out in the memory cells.

The word lines correspond to the rows for the activation of the read ports of memory cells intended to be read or written.

The leakage current below the threshold of a transistor corresponds to the leakage current circulating between the source and the drain of the transistor when same is in the OFF state.

The gate leakage current of a transistor corresponds to the leakage current circulating between the gate and the drain and/or the gate and the source of the transistor when same is in the OFF state.

The standby mode corresponds to a state wherein the SRAM memory is inactive and waits to be put in an active state, and wherein the leakage currents of the SRAM memory are limited.

The term "coupled" designates here a connection that may be direct or indirect between the elements coupled to one another.

The power supply electric potential and the reference electric potential may be applied on the power supply terminals of the global control element.

The reference electric potential may correspond to the ground and have a substantially zero value, or the reference electric potential may have a negative value. When the reference electric potential has a negative value and is applied on the GVGND line, for example, during a reading of memory cells, this makes it possible to increase the current discharge occurring through the GVGND line, and therefore gain in operating speed.

Each of the local control elements may include at least one inverter comprising at least one first PMOS transistor and one first NMOS transistor configured such that:
the source of the first PMOS transistor (that forms the first power supply terminal of the local control element) is coupled to the power supply electric potential,
the source of the first NMOS transistor (that forms the second power supply terminal of the local control element) is coupled to the GVGND line,
the drains of the first PMOS and NMOS transistors, forming an output of the inverter of the local control element, are coupled to the LVGND line associated with the local control element.

In this configuration, the leakage currents eliminated in the local control elements thanks to the GVGND line correspond to the leakage currents below the threshold of the first NMOS transistors.

In addition, in this configuration, a control input of each of the local control elements may be coupled to the gates of the first NMOS and PMOS transistors of the local control element, the memory may further include one or more circuits each configured to apply an electric potential of value substantially equal to the power supply electric potential or to the reference electric potential on the control input of one of the local control elements.

The global control element may include at least one inverter comprising at least one second PMOS transistor and one second NMOS transistor configured such that:
the source of the second PMOS transistor (forming the first power supply terminal of the global control element) is coupled to the power supply electric potential,
the source of the second NMOS transistor (forming the second power supply terminal of the global control element) is coupled to the reference electric potential, the drains of the second PMOS and NMOS transistors, forming an output of the global control element, are coupled to the GVGND line.

In this configuration, a control input of the global control element may be coupled to the gates of the second NMOS and PMOS transistors of the global control element, and the memory may further include one or more circuits each configured to apply an electric potential of value substantially equal to the power supply electric potential or to the reference electric potential on the control input of the global control element.

The SRAM memory may be such that:
a control input of each of the local control elements is coupled to the gates of the first NMOS and PMOS transistors of the local control element;
a control input of the global control element is coupled to the gates of the second NMOS and PMOS transistors of the global control element;
and the memory may further include circuits each configured to apply an electric potential of value substantially equal to the power supply electric potential or to the reference electric potential on the control input of one of the local control elements or of the global control element.

By applying, in standby mode, the power supply electric potential on the gates of the transistors of the local control elements, the gate currents of the local control elements are eliminated.

In this configuration, each of the circuits coupled to the control inputs of the local control elements and of the global control element may correspond to a level shifter circuit configured to output an electric potential of value substantially equal to same of the power supply electric potential or of negative value.

In the standby mode, the circuits coupled to the control inputs of the local control elements may be configured to apply the power supply electric potential on the control inputs of the local control elements.

BRIEF DESCRIPTION OF THE DRAWINGS

The present invention will be better understood upon reading the description of examples of embodiments given, purely by way of indicative and non-limiting example, while referring to the appended drawings wherein.

Identical, similar or equivalent portions of the various figures described hereafter bear the same numerical references such as to facilitate the change from one figure to the other.

The various portions shown in the figures are not necessarily according to a uniform scale, in order to make the figures more readable.

The various possibilities (alternatives and embodiments) must be understood as not being exclusive from one another and may be mutually combined.

DETAILED DESCRIPTION OF SPECIFIC EMBODIMENTS

Figure 1:
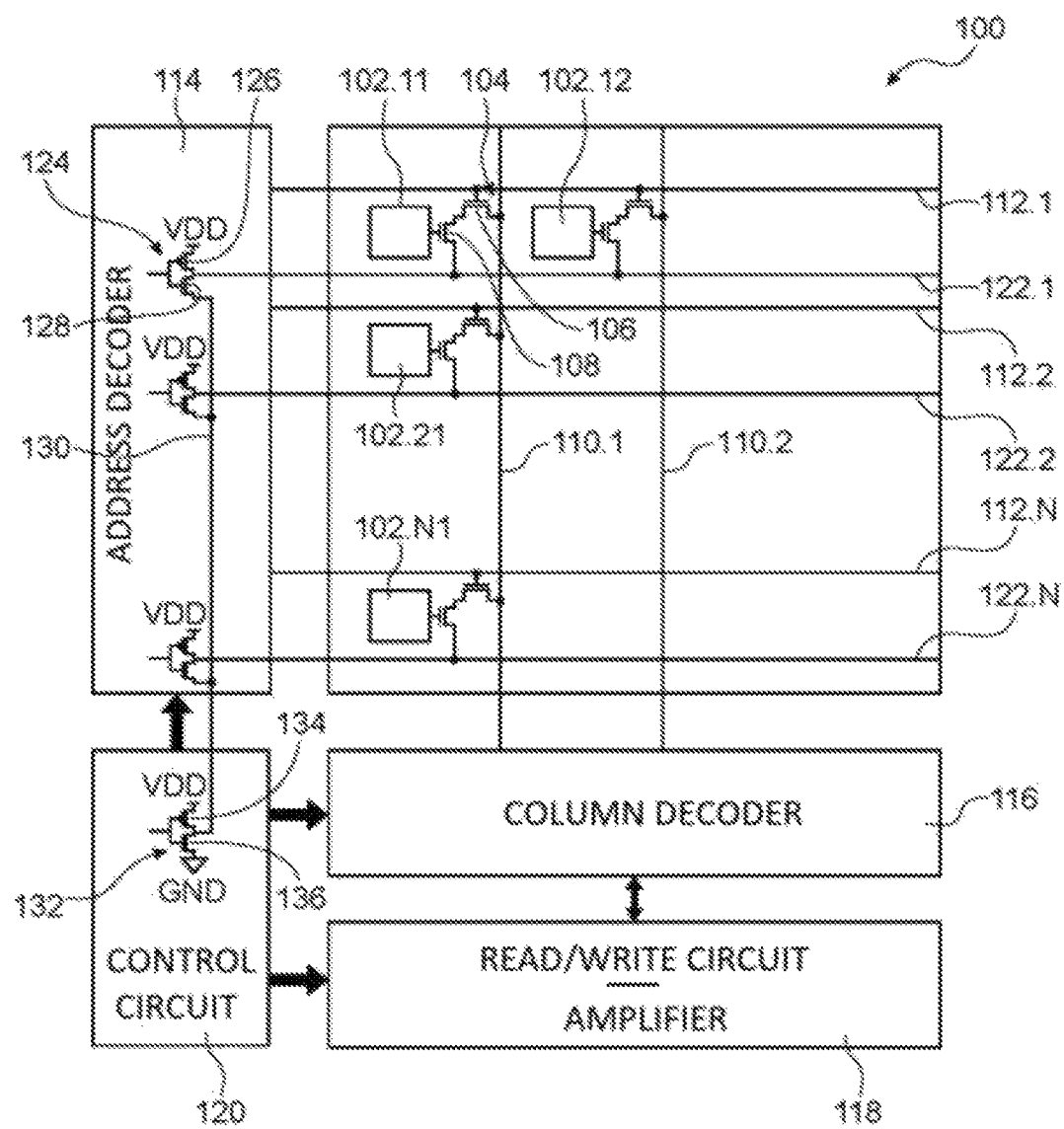
FIG. 1 schematically shows a SRAM memory according to a first embodiment.

FIG. 1 schematically shows a SRAM memory 100 according to a first embodiment. In the description below, only the elements of the memory 100 directly related to the invention are described in detail.

The memory 100 includes a matrix of N rows and M columns of memory cells 102, for example of 6T-SRAM type. In FIG. 1, the memory cells 102 are referenced 102.$ij$, with i corresponding to the row number of the matrix and j corresponding to the column number of the matrix. In FIG. 1, only four memory cells 102 are visible, i.e. the cell 102.11 belonging to the first row and to the first column of the matrix, the cell 102.12 belonging to the first row and to the second column of the matrix, the cell 102.21 belonging to the second row and to the first column of the matrix, and the cell 102.N1 belonging to the $N^{th}$ row (last row) and to the first column of the matrix.

Each memory cell 102 includes the memorisation node thereof coupled to a read port 104. Each read port 104 includes here a first MOS transistor 106 including a first electrode (source or drain depending on the conductivity of the transistor) connected to a first electrode (source or drain depending on the conductivity of the transistor) of a second MOS transistor 108. In the example in FIG. 1, the first and second MOS transistors 106, 108 are of N type, the source of the first MOS transistor 106 being connected to the drain of the second MOS transistor 108. The memorisation node of each memory cell 102 is connected to the gate of the second MOS transistor 108.

The memory 100 also includes M bit lines, or BL, 110, each coupled to the read ports 104 associated with the memory cells 102 of one of the M columns of the matrix. In FIG. 1, each bit line 110 is connected to the second electrodes of the first MOS transistors 106 (at the drains of the first MOS transistors 106 in the example shown) of the read ports 104 associated with the memory cells 102 of one of the M columns of the matrix. In FIG. 1, only the first two bit lines 110.1 and 110.2 are visible.

The memory 100 also includes N word lines, or WL, 112, each coupled to the read ports 104 associated with the memory cells 102 of one of the N rows of the matrix. In FIG. 1, each word line 112 is connected to the gates of the first MOS transistors 106 of the read ports 104 associated with the memory cells 102 of one of the N rows of the matrix. In FIG. 1, only the first and second word lines 112.1, 112.2, as well as the $N^{th}$ (last) word line 112.N are visible.

The memory 100 also includes an address decoder 114 to which the word lines 112 are coupled and selecting, during a read or write in the memory 100, a row of memory cells 102 according to an address line received as input from the address decoder 114.

The memory 100 also includes a column decoder 116 to which the bit lines 110 are coupled. During a read of a row of memory cells 102, the column decoder 116 receives, via the bit lines 110, data read from said row of memory cells 102. During a write in a row of memory cells 102, the column decoder 116 sends on the bit lines 110 the data to be written in said row of memory cells 102. The column decoder 116 is coupled to a read/write and amplification circuit 118 the operation of which is described in detail here.

The memory 100 also includes a control circuit 120 providing notably the control of the address decoder 114, of the column decoder 116 and of the read/write and amplification circuit 118.

The memory 100 also includes local virtual ground, or LVGND, lines 122, each coupled to the reference potential terminals, or ground terminals, of the read ports 104 associated with the memory cells 102 of at least one of the N rows of the matrix. In FIG. 1, each LVGND line 122 is connected to the second electrode of the second MOS transistors 108 (at the sources of the second MOS transistors 108 in the example shown) of the read ports 104 associated with the memory cells 102 of one of the N rows of the matrix. In FIG. 1, only the first and second LVGND lines 122.1, 122.2, as well as the $N^{th}$ (last) LVGND line 122.N are visible. The reference potential terminal of a read port 104 corresponds to the terminal of the read port 104 that is, in a SRAM memory not provided with virtual ground lines, connected to a reference potential corresponding to the ground.

Each of the LVGND lines 122 is coupled to a local control element 124 applying a desired electric potential on the LVGND line 122. In the example in FIG. 1, each local control element 124 corresponds to an inverter consisting of a PMOS transistor 126 and of a NMOS transistor 128, and the output of which is connected to the LVGND line 122 that is associated therewith. The control inputs of the local control elements 124, corresponding to the gates of the transistors 126, 128, are, for example, connected to the control circuit 120 that therefore controls, through the local control elements 124, the values of the electric potentials applied on the various LVGND lines 122.

In order to prevent the generation of leakage currents in the transistors 106, 108 of the read ports 104 towards the local control elements 124 through the LVGND lines 122, the local control elements 124 are not supplied between a power supply electric potential $V_{DD}$ and a reference electric potential GND of fixed value, but between a power supply electric potential $V_{DD}$ (applied on the source of the PMOS transistor 126 that forms a first power supply terminal of the local control element 124) and a global virtual ground, or GVGND, line 130. In the example shown in FIG. 1, it is the source of the second NMOS transistor 128 (forming a second power supply terminal) of each of the local control elements 124 that is connected to the GVGND line 130.

The GVGND line 130 is coupled to a global control element 132 that, in the example in FIG. 1, corresponds to an inverter formed by a PMOS transistor 134 and a NMOS transistor 136. In the example in FIG. 1, the output of this inverter, corresponding to the connection point between the drains of the transistors 134 and 136, is connected to the GVGND line 130. The source of the PMOS transistor 134 forms a first power supply terminal of the global control element 132 on which the power supply electric potential $V_{DD}$ is applied. The source of the NMOS transistor 136 forms a second power supply terminal of the global control element 132 to which the reference electric potential, corresponding to the ground GND in this first embodiment, is applied.

Thus, according to the value of the electric potential applied on the input of the global control element 132 corresponding to the gates of the transistors 134, 136, the global control element 132 applies on the GVGND line 130 an electric potential equal to the power supply electric potential $V_{DD}$ or to the reference electric potential GND. The global control element 132 therefore makes it possible to select the electric potential applied on the GVGND line 130, and therefore also the value of the electric potential applied on the source of the NMOS transistors 128 of each of the local control elements 124.

When the memory 100 is in standby mode, the control circuit 120 is configured so that the global control element 132 and the local control elements 124 output on the GVGND line 130 and on the LVGND lines 122 an electric potential substantially equal to the precharge electric potential applied on the bit lines 110, which corresponds here to the power supply electric potential $V_{DD}$ of the memory 100.

Thus, in the standby mode, due to the fact that the LVGND lines 122 are at the same electric potential as the bit lines 110, the transistors of the read ports 104 are subjected to a substantially zero difference of electric potentials between the second electrode of the MOS transistor 106 and the second electrode of the MOS transistor 108, which prevents the generation of leakage currents below the threshold in the read ports 104.

In addition, in the standby mode, due to the fact that the GVGND line 130 is at the same electric potential as the power supply electric potential $V_{DD}$ applied on the sources of the PMOS transistors 126 of the local control elements 124, these transistors 126, 128 are subjected, between the source of the PMOS transistor 126 and the source of the NMOS transistor 128, to a substantially zero difference of electric potentials, also preventing the generation of leakage currents below the threshold in the local control elements 124.

In the memory 100, the only leakage current below the threshold generated in the standby mode therefore comes from the NMOS transistor 136 of the global control element 132, which represents, by considering all of the transistors of the memory 100, a significant reduction of these leakage currents below the threshold compared to the configuration where each of the local control elements 124 is directly connected to the ground and where a leakage current below the threshold is therefore generated in each of the local control elements 124 when the memory 100 is in standby mode.

Furthermore, in the standby mode, due to the fact that the transistors 126, 128 of each of the local control elements 124 are subjected, between the source of the PMOS transistor 126 and the source of the NMOS transistor 128, to a substantially zero difference of electric potentials, and therefore that the voltage $V_{DS}$ at the terminals of the transistors 126, 128 is zero, it is possible to eliminate the gate leakage currents of the transistors 126, 128 of the local control elements 124 by applying as input of the local control elements 124, that is to say on the gates of the transistors 126, 128, an electric potential of value substantially equal to same applied on the sources of the transistors 126, 128, that is to say $V_{DD}$. In this case, due to the fact that the transistors 126, 128 of the local control elements 124 are subjected, between the source and the gate of the PMOS transistor 126, and between the source and the gate of the NMOS transistor 128, to a substantially zero difference of electric potentials, no gate leakage current is generated in the transistors 126, 128 of the local control elements 124.

When the memory 100 is in standby mode, the only gate leakage current generated therefore comes from the NMOS and PMOS transistors of the global control element 132, which represents, by considering all of the transistors of the memory 100, a significant reduction of these gate leakage currents compared to the configuration where each of the local control elements 124 is directly connected to the ground and where the gate leakage currents are therefore generated in each of the transistors of the local control elements 124 when the memory 100 is in standby mode, due to the fact that a substantially zero electric potential must inevitably be applied on the gates of these transistors in order to obtain on the VGND lines an electric potential of value similar to same of the power supply electric potential.

During the reading of one of the rows of memory cells 102, M read currents, coming from the M memory cells 102 of the row read, pass through the LVGND line 122 to which are coupled the memory cells 102 of the row read, then through the GVGND line 130. During this reading, the local control element 124 that is coupled to this LVGND line 122 and the global control element 132 may bias this LVGND line 122 and the GVGND line 130 at an electric potential corresponding to the reference electric potential that corresponds to the ground GND in this first embodiment (via the application of an electric potential equivalent to the potential $V_{DD}$ on the gate thereof).

For the rows of memory cells 102 not read, the electric potentials applied on the LVGND lines 122 that are coupled to the read ports 104 associated with the cells 102 of these rows have a value substantially similar to same of the precharge electric potential applied on the bit lines 110. Therefore, there is no difference of potentials between the bit lines 110 and these LVGND lines 122 to which the read ports 104 of the cells 102 of the rows not read are coupled, and therefore no leakage current below the threshold of the transistors 106, 108 of these read ports 104.

The channels of the transistors 128 of the local control elements 124 are dimensioned with a width W for the passage of the read currents of all of the memory cells 102 of a row of the matrix of memory cells 102, that is to say to enable the simultaneous passage of M read currents.

In order to minimise the leakage current below the threshold generated in the transistor 136 of the global control element 132 when the memory 100 is in standby mode, the transistors 134, 136 of the global control element 132 advantageously include a high threshold voltage and correspond to transistors of HVT, or "High Voltage Threshold" or RVT, or "Regular Voltage Threshold" type. This high threshold voltage, for example between approximately 300 mV and 400 mV in 28 nm technology, makes it possible to have a low static consumption, therefore a low $I_{OFF}$ current, of these transistors 134, 136. By contrast, this high threshold voltage also has the consequence of reducing the $I_{ON}$ current of the transistors 134, 136. However, this reduction of $I_{ON}$ current is compensated for by the fact that the width W of the transistors 134, 136 of the global control element 132 is significant.

Furthermore, due to the fact that the leakage currents below the threshold were eliminated from the local control elements 124 when the memory 100 is in standby mode, it is not wise to have transistors 126, 128 of the local control elements 124 of HVT or RVT type. Advantageously, the transistors 126, 128 include a low voltage threshold, for example, in the order of 300 mV, and are of LVT, or "Low Voltage Threshold" type, or more generally include a threshold voltage of value lower than same of the threshold voltage of the transistors 134, 136 of the global control element 132. Thus, the local control elements 124 maintain a significant operating speed.

During the operation of the memory 100, the less significant operating speed of the global control element 132 (due to the high threshold voltage of the transistors 134, 136 of the global control element 132) may be compensated for by activating in advance this global control element 132, that is to say by applying an electric control potential on the input of the global control element 132 before same applied on the inputs of the local control elements 124.

When the transistors used in the memory 100 are of FDSOI type, it is possible to modify the value of the threshold voltage of these transistors by modifying the biasing voltage applied on the rear gate of these transistors. This possibility of biasing via the rear face of the transistors is advantageous notably for the transistors 106, 108 of the read ports 104.

In the first embodiment described above, the local control elements 124 are produced in the address decoder 114 and the global control element 132 is produced in the control circuit 120. Alternatively, it is possible that the local control elements 124 and/or the global control element 132 are produced in one or more different portions of the memory 100 of the address decoder 114 and/or of the control circuit 120.

In addition, in the first embodiment described above, each row of memory cells 102 is associated with a LVGND line 122 that is specific thereto. The memory 100 therefore includes N LVGND lines 122. Alternatively, it is possible that the memory 100 includes N/2 or (N/2)+1 LVGND lines 122 (N/2 when N is even, and (N/2)+1 when N is odd), each coupled to the read ports 104 belonging to two consecutive rows of memory cells 102. In this alternative, the memory 100 therefore includes N/2 or (N/2)+1 local control elements 124 each coupled to one of the LVGND lines 122.

Figure 2:
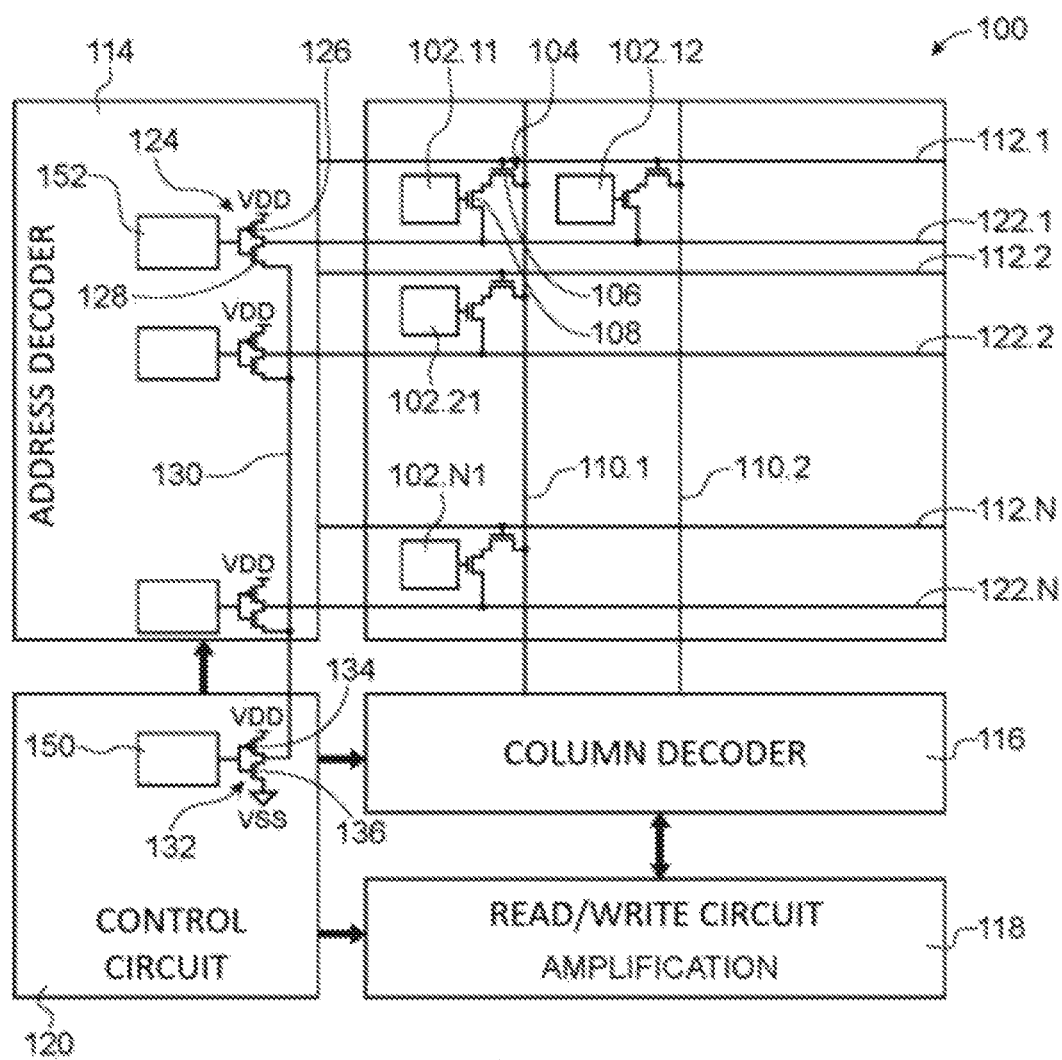
FIG. 2 schematically shows a SRAM memory according to a second embodiment.

A SRAM memory 100 according to a second embodiment is described below in relation to FIG. 2.

The memory 100 according to this second embodiment comprises all of the elements of the memory 100 according to the first embodiment previously described.

However, unlike the first embodiment, the reference electric potential does not correspond to the ground GND but to a negative electric potential called $V_{SS}$. Thus, the electric potential applied on the GVGND line 130 and the LVGND lines 122 is equal to the power supply electric potential $V_{DD}$ or to the negative electric potential $V_{SS}$, which is, for example, equal to $-V_{DD}$. In order to be able to apply one or the other of these potentials on the input of the global control element 132, that is to say on the gates of the transistors 134, 136, the memory 100 includes, for example, a level shifter circuit 150 receiving as input an electric potential of value equal to 0 or VDD, and outputting an electric potential of value equal to $V_{SS}$ (when the input electric potential is equal to 0) or to $V_{DD}$ (when the input electric potential is equal to $V_{DD}$). The output of this circuit 150 is coupled to the input of the global control element 132. In addition, the negative electric potential $V_{SS}$ is also applied on the power supply terminal of the global control element 132 intended to receive the reference electric potential, that is to say the source of the NMOS transistor 136.

The memory 100 according to this second embodiment also includes N level shifter circuits 152, each similar to the circuit 150 and the output of which is coupled to the input of one of the local control elements 124.

In standby mode, the operation of the memory 100 according to this second embodiment is similar to same previously described for the memory 100 according to the first embodiment.

During the reading or the writing in one of the rows of the memory 100 according to this second embodiment, the local control element 124 that is coupled to the LVGND line 122 associated with the row of the memory cells 102 read and the global control element 132 bias this LVGND line 122 and the GVGND line 130 at the electric potential $V_{SS}$. An electric potential of value equal to $V_{DD}$ is therefore applied as input of the global control element 132 and as input of the local control element 124 associated with the line read. Thus, a greater current discharge is obtained from the bit lines 110 and through the read ports 104 of the memory cells 102 read and the LVGND 122 and GVGND lines 130 that are coupled to the electric potential $V_{SS}$ through the local control element 124 associated with the row of memory cells 102 read and through the global control element 132. This current discharge is therefore faster than when the global control element 132 and the local control element 124 apply a potential GND on the GVGND 130 and LVGND lines 122, thus increasing the operating speed of the memory 100.

Figure 3:
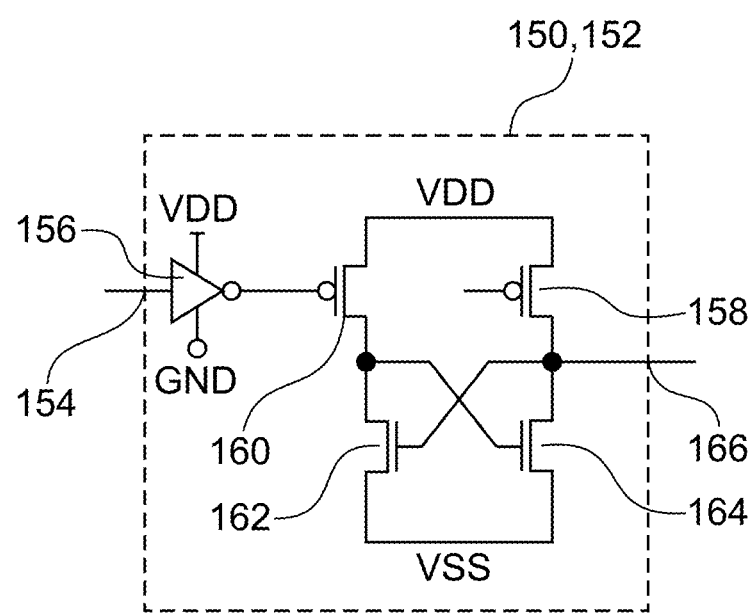
FIG. 3 schematically shows one example of embodiment of a voltage level shifter circuit.

One example of embodiment of the circuit 150 (or of one of the circuits 152 that may be similar to the circuit 150) is shown in FIG. 3.

The circuit 150 includes an input 154 on which is applied the input signal. This input signal is sent to the input of an inverter 156 and on the gate of a PMOS transistor 158. The output of the inverter 156 is connected to the gate of another PMOS transistor 160. The sources of the PMOS transistors 158, 160 are connected to the electric potential $V_{DD}$. The drain of the PMOS transistor 158 is connected to the gate of an NMOS transistor 162 and to the drain of another NMOS transistor 164. The drain of the PMOS transistor 160 is connected to the gate of the NMOS transistor 164 and to the drain of the NMOS transistor 162. The sources of the NMOS transistors 162, 164 are connected to the electric potential $V_{SS}$. An output 166 of the circuit 150 is obtained at the connection point between the gate of the NMOS transistor 162 and the drains of the PMOS transistor 158 and of the NMOS transistor 164.

With such a circuit 150, the signal obtained on the output 166 has for value $V_{DD}$ or $V_{SS}$ depending on whether the input signal has for value $V_{DD}$ or GND.

Figure 4:
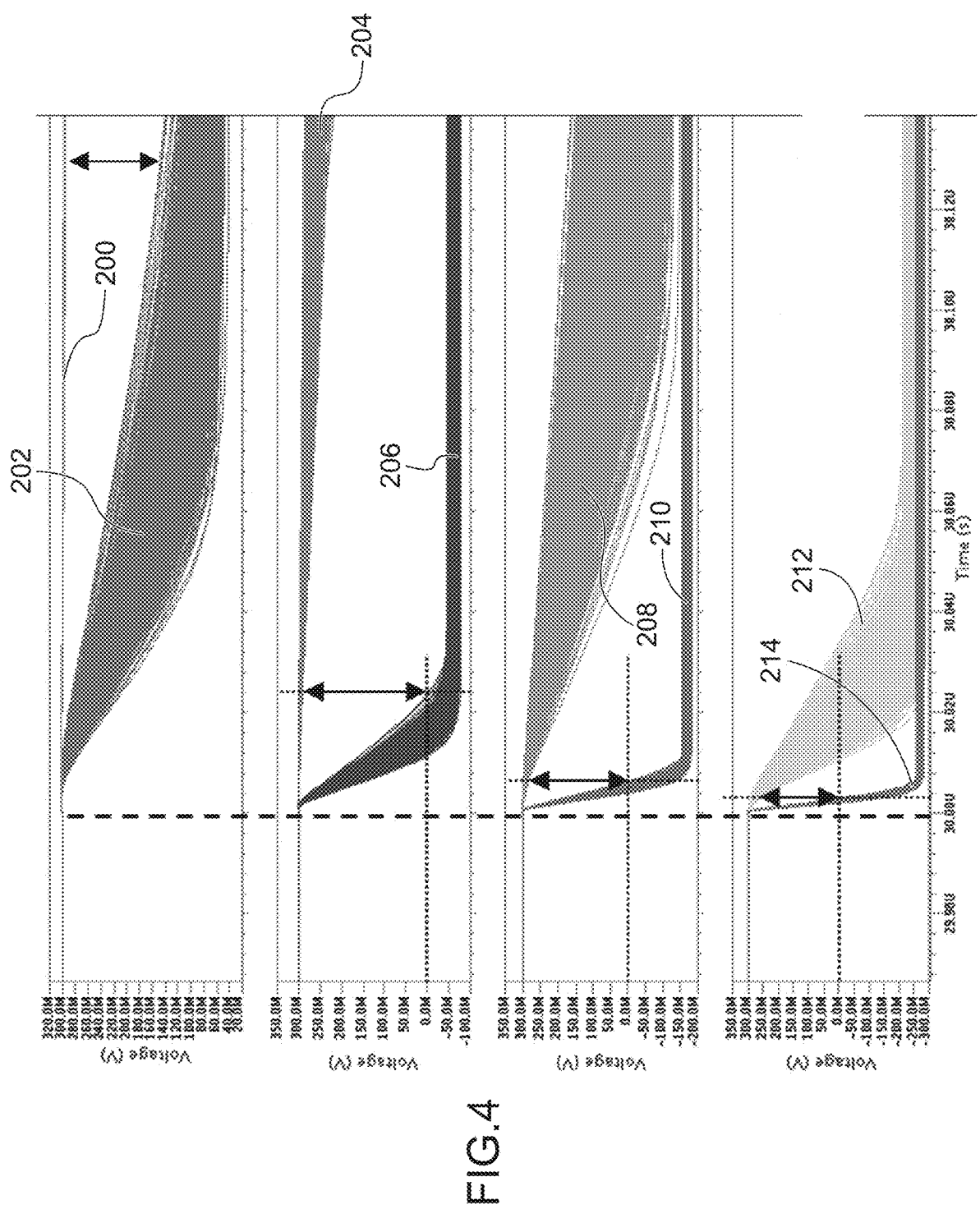
FIGS. 4 and 5 show the discharge times obtained in the SRAM memory for various configurations.

FIG. 4 shows, for various values of $V_{SS}$, the discharge of the electric potential on one of the bit lines 110, during the reading of a memory cell 102 of the memory 100. These results were obtained by using a power supply electric potential $V_{DD}$=0.3 V that corresponds to the precharge electric potential of the bit line 110. The reference 200 designates the discharge of the potential in the bit line 110 during the reading of a '0' bit (corresponding to a potential GND) stored in the memory cell 102 read, and the reference 202 designates the discharge of the potential in the bit line 110 during the reading of a '1' bit (corresponding to a potential $V_{DD}$) stored in the memory cell 102, when the memory 100 is produced according to the first embodiment, that is to say when the negative electric potential $V_{SS}$ is not used.

The reference 204 designates the discharge of the potential in the bit line 110 during the reading of a '0' bit, and the reference 206 designates the discharge of the potential in the bit line 110 during the reading of a '1' bit, when the memory 100 is produced according to the second embodiment with $V_{SS}$=−0.1 V. The reference 208 designates the discharge of the potential in the bit line 110 during the reading of a '0' bit, and the reference 210 designates the discharge of the potential in the bit line 110 during the reading of a '1' bit, with $V_{SS}$=−0.2 V. Lastly, the reference 212 designates the discharge of the potential in the bit line 110 during the reading of a '0' bit, and the reference 214 designates the discharge of the potential in the bit line 110 during the reading of a '1' bit, with $V_{SS}$=−0.3 V.

The arrows drawn in FIG. 4 each show the instant from which a sufficient deviation is obtained to discriminate the value of the bit read. Thus, it becomes clear that the use of a reference electric potential $V_{SS}$ of negative value applied on the GVGND 130 and LVGND lines 122 during the reading makes it possible to significantly reduce the discharge time of the potential of the bit line 110 during the reading of a '1' bit, whilst maintaining, during the reading of a '0' bit, an electric potential close to $V_{DD}$ for a sufficient time to discriminate the value of the bit read.

It should also be noted that the connection of the transistors 128 of the local control elements 124 to the GVGND line 130 and to the global control element 132 enables the memory 100 to operate correctly, even at a high temperature, for example, in the order of 125° C.

Figure 5:
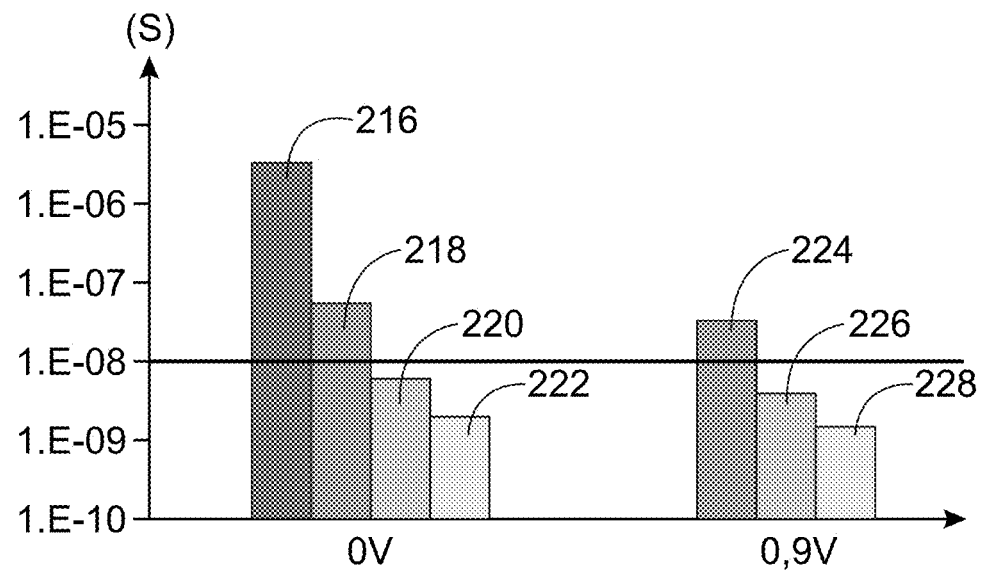
Figure 5:
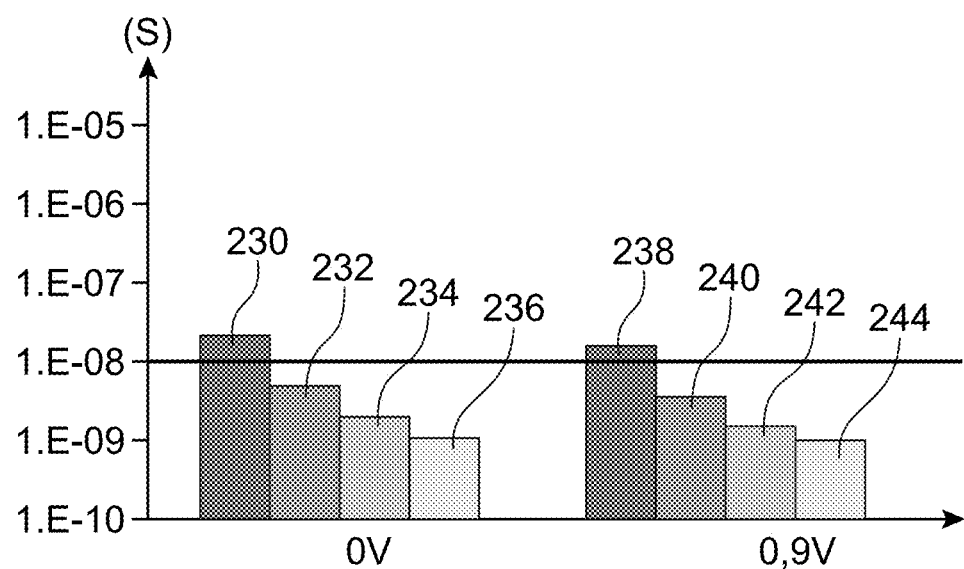

The histogram drawn in FIG. 5 shows the time for obtaining a reduction of 50 mV of the electric potential of the bit line 110, during a reading in the memory 100, with a power supply electric potential $V_{DD}$=0.3 V and for various values of the potential applied on the LVGND 122 and the GVGND 130. The reference 216 shows this discharge time for the memory 100 according to the first embodiment, and the references 218, 220 and 222 show this discharge time for the memory 100 according to the second embodiment with the reference electric potential $V_{SS}$ respectively equal to −0.1 V, −0.2 V and −0.3 V, at a temperature of −40° C. The references 224, 226 and 228 show this discharge time for the memory 100 according to the second embodiment with the reference electric potential $V_{SS}$ respectively equal to −0.1 V, −0.2 V and −0.3 V, and with a rear face biasing of 0.9 V applied on the transistors 106, 108 of the read ports 104, also at a temperature of −40° C. The reference 230 shows this discharge time for the memory 100 according to the first embodiment, and the references 232, 234 and 236 show this discharge time for the memory 100 according to the second embodiment with the reference electric potential $V_{SS}$ respectively equal to −0.1 V, −0.2 V and −0.3 V, at a temperature of 125° C. The reference 238 shows this discharge time for the memory 100 according to the first embodiment, and with a rear face biasing of 0.9 V applied on the transistors 106, 108 of the read ports 104, also at a temperature of 125° C. The references 240, 242 and 244 show this discharge time for the memory 100 according to the second embodiment with the reference electric potential $V_{SS}$ respectively equal to −0.1 V, −0.2 V and −0.3 V, and with a rear face biasing of 0.9 V applied on the transistors 106, 108 of the read ports 104, also at a temperature of 125° C.

The table below summarises the leakage currents obtained in the read ports 104 of a memory 100 comprising a matrix of 1024 rows and 32 columns of memory cells 102, in standby mode, according to the various configurations:

|  | No. of cells | Ref (nW) | $1^{st}$ mode (nW) | $2^{nd}$ mode (nW) |
| --- | --- | --- | --- | --- |
| RVT | 1024 | 303 | 0.108 | 0.037 |
| RVT | 1 | 0.2958984 | 1.05469E−4 | 3.61328E−5 |
| RVT | 32768 | 9636 | 3.456 | 1.184 |
| LVT without FBB | 1024 | 1000 | 0.802 |  |
| LVT without FBB | 1 | 0.9765625 | 7.83203E−4 | 2.75391E−4 |
| LVT without FBB | 32768 | 32000 | 25.664 | 9.024 |
| LVT with FBB | 1024 | 1920 | 0.816 | 0.283 |
| LVT with FBB | 1 | 1.875 | 7.96875E−4 | 2.76367E−4 |
| LVT with FBB | 32768 | 61440 | 26.112 | 9.056 |

In the table above, the "RVT" rows correspond to the configurations where the transistors of the read ports 104 and of the local control elements 124 are of RVT type. The "LVT without FBB" rows correspond to the configurations where the transistors of the read ports 104 and of the local control elements 124 are of LVT type without biasing of the rear face thereof. The "LVT with FBB" rows correspond to the configurations where the transistors of the read ports 104 and of the local control elements 124 are of LVT type with a biasing of the rear face thereof. The "Ref" column corresponds to the leakages obtained in a memory wherein the global control element 132 and the GVGND line 130 are absent, the sources of the transistors 128 of the local control elements 124 being connected to the ground. The "1ˢᵗ mode" column corresponds to the leakages obtained in the memory 100 according to the first embodiment, and the "2ⁿᵈ mode" column corresponds to the leakages obtained in the memory 100 according to the second embodiment.

The table below summarises the leakage currents obtained in the local control elements 124 and global control elements 130, in standby mode, according to various configurations:

|  | No. of cells | Ref (nW) | 1$^{st}$ mode (nW) | 2$^{nd}$ mode (nW) |
|---|---|---|---|---|
| RVT | 1024 | 730 | 1.05 | 0.66 |
| LVT without FBB | 1024 | 2252 | 4.67 | 2.03 |
| LVT with FBB | 1024 | 4130 | 6.52 | 2.71 |

The table below summarises the leakage currents obtained in the whole memory 100, in standby mode, according to various configurations:

|  | Ref (nW) | 1$^{st}$ mode (nW) | 2$^{nd}$ mode (nW) |
|---|---|---|---|
| RVT | 10426 | 4.506 | 1.844 |
| LVT without FBB | 34252 | 30.334 | 11.054 |
| LVT with FBB | 65570 | 32.632 | 11.766 |

These tables clearly show the significant reduction of leakage currents obtained by implementing the invention regardless of the embodiment thereof.

In the examples of embodiments previously described, the global control element 132 includes a PMOS transistor 134 coupled to an NMOS transistor 136. Alternatively, it is possible that the global control element 132 includes a power gate for, when the memory 100 is in standby mode, reducing the leakage current generated from the NMOS transistor 136. This power gate is, for example, interposed between the reference electric potential (corresponding to the ground or to the negative electric potential $V_{SS}$) and the NMOS transistor 136. This power gate corresponds, for example, to an additional NMOS transistor comprising the gate thereof connected to the gate of the NMOS transistor 136, the drain thereof connected to the source of the NMOS transistor 136 (the source of the NMOS transistor 136 no longer being directly connected to the reference electric potential), and the source thereof connected to the reference electric potential.

The invention claimed is:

1. SRAM memory including at least:
one matrix of memory cells forming columns and rows of memory cells;
bit lines each associated with one of the columns of memory cells, and word lines each associated to one of the rows of memory cells;
read ports each associated with one of the memory cells and coupled to one of the bit lines and one of the word lines;
local virtual ground lines, called LVGND lines, each coupled to reference potential terminals of the read ports of at least one of the rows of memory cells;
local control elements each configured to electrically couple one of the LVGND lines to a power supply electric potential applied on a first power supply terminal of the local control elements or to a global virtual ground line, called GVGND line, to which a second power supply terminal of the local control elements is coupled; and
one global control element configured to couple the GVGND line to the power supply electric potential or to a reference electric potential.

2. SRAM memory according to claim 1, wherein the reference electric potential corresponds to the ground and has a substantially zero value, or wherein the reference electric potential has a negative value.

3. SRAM memory according to claim 1, wherein each of the local control elements includes at least one inverter comprising at least one first PMOS transistor and one first NMOS transistor configured such that:
a source of the first PMOS transistor is coupled to the power supply electric potential,
a source of the first NMOS transistor is coupled to the GVGND line, and
drains of the first PMOS and NMOS transistors, forming an output of the inverter of the local control element, are coupled to the LVGND line associated with the local control element.

4. SRAM memory according to claim 1, wherein the global control element includes at least one inverter comprising at least one second PMOS transistor and one second NMOS transistor configured such that:
a source of the second PMOS transistor is coupled to the power supply electric potential,
a source of the second NMOS transistor is coupled to the reference electric potential, and
drains of the second PMOS and NMOS transistors, forming an output of the global control element, are coupled to the GVGND line.

5. SRAM memory according to claim 3, wherein the global control element includes at least one inverter comprising at least one second PMOS transistor and one second NMOS transistor configured such that:
a source of the second PMOS transistor is coupled to the power supply electric potential,
a source of the second NMOS transistor is coupled to the reference electric potential, and
drains of the second PMOS and NMOS transistors, forming an output of the global control element, are coupled to the GVGND line,
wherein:
a control input of each of the local control elements is coupled to gates of first NMOS and PMOS transistors of the local control element; and
a control input of the global control element is coupled to gates of the second NMOS and PMOS transistors of the global control element;
and further including circuits each configured to apply an electric potential of value substantially equal to the power supply electric potential or to the reference electric potential on the control input of one of the local control elements or of the global control element.

6. SRAM memory according to claim 5, wherein each of the circuits coupled to the control inputs of the local control elements and of the global control element corresponds to a level shifter circuit configured to output an electric potential of value substantially equal to same of the power supply electric potential or of negative value.

7. SRAM memory according to claim 1, wherein, in a standby mode, the SRAM memory is configured such that:
a precharge electric potential substantially equal to the power supply electric potential is applied on the bit lines, the local control elements electrically couple the LVGND lines to the power supply electric potential, and the global control element couples the GVGND line to the power supply electric potential.

8. SRAM memory according to claim 5, wherein, in a standby mode, the SRAM memory is configured such that:

a precharge electric potential substantially equal to the power supply electric potential is applied on the bit lines, the local control elements electrically couple the LVGND lines to the power supply electric potential, and the global control element couples the GVGND line to the power supply electric potential, wherein, in the standby mode, the circuits coupled to the control inputs of the local control elements are configured to apply the power supply electric potential on the control inputs of the local control elements.

9. SRAM memory according to claim 1, wherein, when the local control elements and the global control element each include MOS transistors, the MOS transistors of the global control element include a threshold voltage greater than same of the MOS transistors of the local control elements.

10. SRAM memory according to claim 1, wherein, during a reading of one of the rows of memory lines, the SRAM memory is configured such that:

one of the local control elements couples the LVGND line that is associated with the row of the memory cells read to the GVGND line, the other local control elements couple the other LVGND lines to the power supply electric potential, and the global control element couples the GVGND line to the reference electric potential.

11. SRAM memory according to claim 1, wherein the local control elements form part of an address decoder of the SRAM memory, and wherein the global control element forms part of a control circuit of the SRAM memory suitable for sending control signals to the address decoder.

12. SRAM memory according to claim 1, wherein each LVGND line is coupled to the reference potential terminals of the read ports of two successive rows of memory cells.

* * * * *